(12) United States Patent
Lee et al.

(10) Patent No.: US 11,621,287 B2
(45) Date of Patent: Apr. 4, 2023

(54) OPTICAL SENSOR DEVICE WITH REDUCED THICKNESS AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 146 days.

(21) Appl. No.: 16/850,490

(22) Filed: Apr. 16, 2020

(65) Prior Publication Data
US 2021/0327941 A1    Oct. 21, 2021

(51) Int. Cl.
*H01L 27/146* (2006.01)
*G02B 27/30* (2006.01)
*G06V 40/13* (2022.01)

(52) U.S. Cl.
CPC ........ *H01L 27/14627* (2013.01); *G02B 27/30* (2013.01); *G06V 40/13* (2022.01); *H01L 27/14623* (2013.01); *H01L 27/14685* (2013.01)

(58) Field of Classification Search
CPC ........ H01L 27/14627; H01L 27/14623; G02B 27/30; G06V 40/13
See application file for complete search history.

(56) References Cited

U.S. PATENT DOCUMENTS

| 2007/0164193 A1* | 7/2007 | Lee ................... H01L 27/14627 257/432 |
| 2020/0127031 A1* | 4/2020 | Suzuki .............. H01L 27/14692 |
| 2021/0183917 A1* | 6/2021 | Otake ................... H01L 27/146 |

FOREIGN PATENT DOCUMENTS

| CN | 206470775 U | 9/2017 | |
| CN | 110323238 A | * 10/2019 | |
| CN | 110473887 A | * 11/2019 | ............... G06K 9/00 |

OTHER PUBLICATIONS

Taiwanese Office Action and Search Report for Taiwanese Application No. 109103479, dated Nov. 26, 2020.

\* cited by examiner

*Primary Examiner* — Nelson Garces
(74) *Attorney, Agent, or Firm* — Birch, Stewart, Kolasch & Birch, LLP

(57) ABSTRACT

An optical sensor device and a method for forming the same are provided, including forming a curable transparent material on a substrate, wherein the substrate has a plurality of optical sensor units therein; providing a transparent template, which has a plurality of concaves; imprinting the curable transparent material with the transparent template to form a plurality of convexes corresponding to the plurality of concaves; and curing the curable transparent material to form a transparent layer having a micro-lens array. The step of curing the curable transparent material includes adhering the transparent template to the curable transparent material to act as a cover plate for the optical sensor device.

21 Claims, 9 Drawing Sheets

OPTICAL SENSOR DEVICE WITH REDUCED THICKNESS AND METHOD FOR FORMING THE SAME

BACKGROUND

Technical Field

The present disclosure relates to an optical sensor device, and specifically to an optical sensor device including micro-lenses, and methods for forming the same.

Description of the Related Art

Optical sensor devices may be used in various applications. For example, optical sensor devices may be used as fingerprint identification devices (or at least a part of the fingerprint identification devices). Fingerprint identification devices may be composed of a large quantity of optical elements. For example, the optical elements described may include light collimators, beam splitters, focusing mirrors, linear sensors, or the like.

The function of the light collimators is the collimating of light rays, to reduce energy loss due to light divergence. For example, the light collimators may be applied in fingerprint identification devices to increase the efficiency of the fingerprint identification devices. However, in the process of manufacturing light collimators, internal structures (for example, micro-lenses or the like) of the light collimators affect the thicknesses and the number of the interfaces of the internal devices of the light collimators. Therefore, not only the collimating effect of the light collimators is affected, a yield of the optical fingerprint identification devices may be further affected as well.

Even though current optical sensor devices may be adequate for their intended purposes, they have not been entirely satisfactory in every aspect. Specifically, the thickness and the number of the interfaces within the optical sensor devices still require further improvement.

SUMMARY

The embodiments of the present disclosure provide an optical sensor device, including, a substrate, a light collimating structure, and a transparent cover plate. The substrate has optical sensor units therein. The light collimating structure is disposed on the substrate, wherein the light collimating structure includes a transparent layer and a plurality of light-shielding layers. The transparent layer has a plurality of micro-lenses arranged in an array. The plurality of light-shielding layers are disposed on the transparent layer between the micro-lenses. The transparent cover plate is disposed on the light collimating structure, wherein the transparent cover plate is formed of a single transparent material and is in direct contact with the micro-lenses.

The embodiments of the present disclosure also provide a method of forming an optical sensor device, including: forming a curable transparent material on a substrate; providing a transparent template, wherein the transparent template has a plurality of concaves; imprinting the curable transparent material with the transparent template to form a plurality of convexes corresponding to the concaves; and curing the curable transparent material to form a transparent layer with an array of micro-lenses therein, wherein the curing of the curable transparent material includes adhering the transparent template to the curable transparent material to act as a cover plate for the optical sensor device. The substrate has a plurality of optical sensor units therein.

BRIEF DESCRIPTION OF THE DRAWINGS

Aspects of the present disclosure are best understood from the following detailed description when read with the accompanying figures. It is noted that, various features are not drawn to scale, and are only used for illustrative purpose. In fact, the dimensions of the various features may be arbitrarily increased or reduced for clarity of discussion.

DETAILED DESCRIPTION

Figure 1:
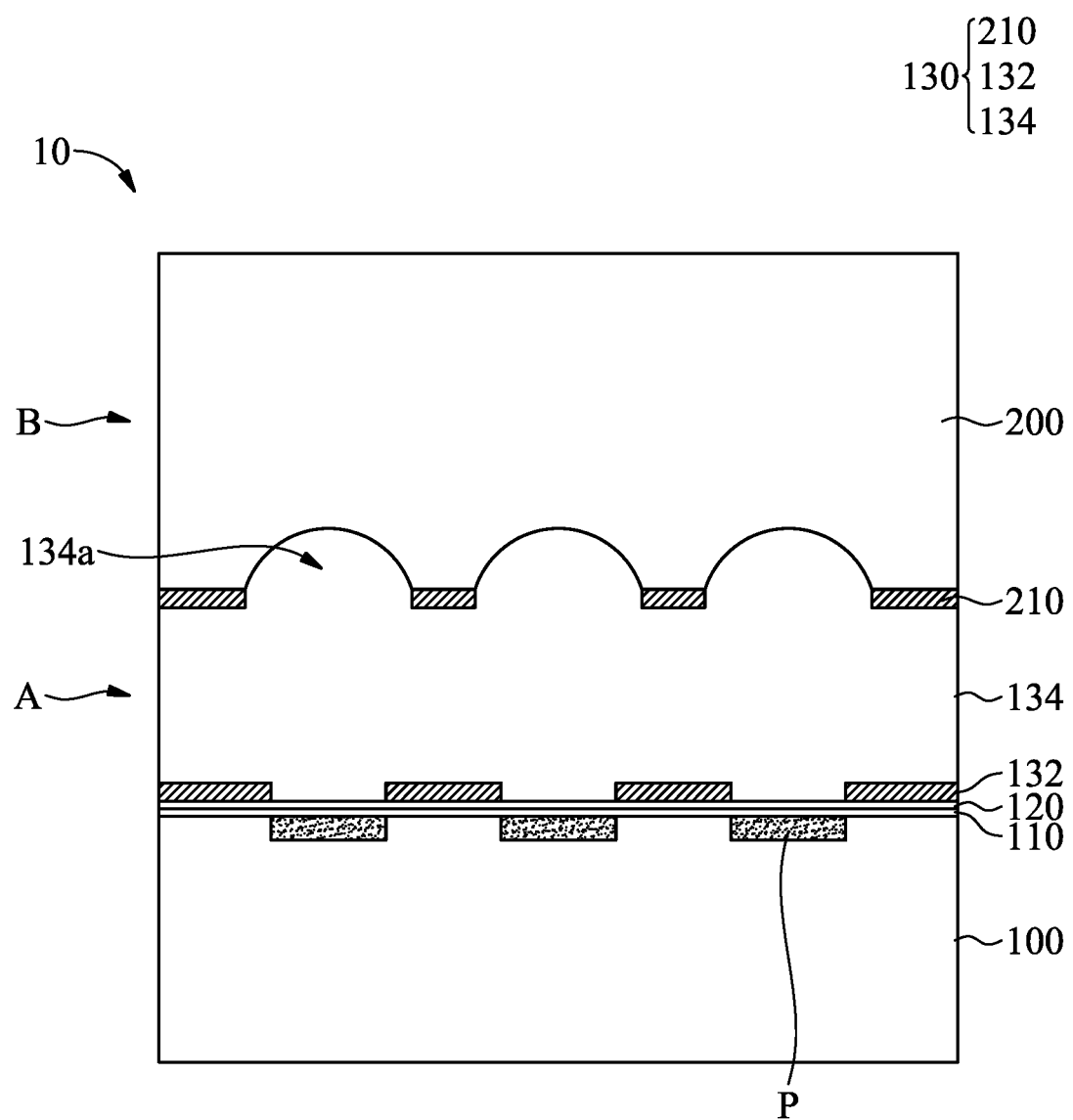
FIG. 1 illustrates a cross-sectional view of an optical sensor device according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional operating procedures may be implemented before, during, or after the methods described. In other embodiments of the methods described, part of the operating procedures may be replaced or omitted.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms used herein (including technical and scientific terms) have same meanings as comprehended by those skilled in the art. It should be understood that these terms, such as generally defined by commonly used dictionaries, should be interpreted in consistent with related technology and background information of the present disclosure, and should not be interpreted in idealized or overly formal ways, unless they have specific definitions in the embodiments of the present disclosure.

The following disclosed embodiments may repeat reference numerals and/or letters in various embodiments. This repetition is for the purpose of simplicity and clarity, and does not in itself dictate a relationship between the various embodiments discussed.

A transparent cover plate of an optical sensor device contacts directly with optical micro-lenses in an embodiment of the present disclosure. Since it is no need to use an optical cement as an adhesive layer between the transparent cover plate and the optical micro-lenses, at least two interfaces may be eliminated in an optical path of collimation, thereby increasing the collimation performance. Furthermore, since the conventional adhesive layer including the optical cement is not present, an overall thickness of the optical sensor device can be reduced, and process cost can also be reduced.

FIG. 1 illustrates a cross-sectional view of the optical sensor device, according to some embodiments of the present disclosure. First, according to some embodiments, as shown in FIG. 1, the optical sensor device 10 includes a substrate 100, a light collimating structure 130, and a transparent cover plate 200.

In some embodiments, the substrate 100 may be a semiconductor substrate, for example, silicon substrate. Furthermore, in some embodiments, the semiconductor substrate may also be an elemental semiconductor including germanium, a compound semiconductor including gallium nitride (GaN), silicon carbide, gallium arsenide, gallium phosphide, indium phosphide, indium arsenide, and/or indium antimonide, an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or the combinations thereof.

In other embodiments, the substrate 100 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 100 may be an N-type or a P-type conductive type.

In some embodiments, the substrate 100 may include various isolation elements (not shown) to define active regions, and to electrically isolate active region elements within or above the substrate 100. In some embodiments, isolation elements may include shallow trench isolation (STI) elements, local oxidation of silicon (LOCOS) elements, other suitable isolation elements, or the combinations thereof. In some embodiments, the formation of the isolation elements may include, for example, forming an insulating layer on the substrate 100, selectively etching the insulating layer and the substrate 100 to form trenches within the substrate 100, growing rich nitrogen-containing (such as silicon oxynitride) liners in the trenches, and filling insulating materials (such as silicon dioxide, silicon nitride, or silicon oxynitride) into the trenches with deposition processes, then performing annealing processes on the insulating materials in the trenches, and performing planarization processes on the substrate 100 to remove excessive insulating materials, so the insulating materials in the trenches are level with the top surface of the substrate 100.

In some embodiments, the substrate 100 may include various P-type doped regions and/or N-type doped regions (not shown) formed of, for example, ion implantation and/or diffusion process. In some embodiments, transistors, photodiodes, or the like, may be formed at the doped regions, and the doped regions may include various conducting elements (for example, metal lines or vias) (not shown). For example, the conducting elements described may be formed with aluminum, copper, tungsten, other suitable conducting materials, the alloys thereof, or the combinations thereof. However, the elements described are merely examples, the present disclosure is not limited hereto.

In some embodiments, as shown in FIG. 1, the substrate 100 may include a plurality of optical sensor units P therein. In some embodiments, the optical sensor units P include pixels, which may be connected with signal processing circuitry (not shown). In some embodiments, the quantity of the optical sensor units P depends on the area of an optical sensor region. Every optical sensor unit P may include one or more photodetectors. In some embodiments, the photodetectors may include photodiodes, wherein the photodiodes may include photoelectric materials of a tri-layer structure including a P-type semiconductor layer, an intrinsic layer, and an N-type semiconductor layer. The intrinsic layer may absorb light to generate excitons, and the excitons may be separated into electrons and holes at the interface of the P-type semiconductor layer and the N-type semiconductor layer, thereby generating current signals. In other embodiments, the photodetectors may also include charged coupling devices (CCD) detectors, complimentary metal-oxide-semiconductor (CMOS) image sensors, active sensors, passive sensors, other suitable sensors, or the combinations thereof. In some embodiments, the optical sensor units P may transform received optical signals into electronic signals by photodetectors, and the electronic signals described may be processed through the signal processing circuitry.

It should be noted that the quantity and arrangement of the optical sensor units P shown in FIG. 1 are illustrative, embodiments of the present disclosure are not limited hereto. In other words, optical sensor units P may be arrays of any numbers of rows and columns, or any arrangement methods.

Next, according to some embodiments, as shown in FIG. 1, a light collimating structure 130 is disposed on the substrate 100, and may include a transparent layer 134 and a plurality of light-shielding layers 210 on the transparent layer 134.

In some embodiments, the transparent layer 134 is disposed on the substrate 100. In some embodiments, the transparent layer 134 may include a curable transparent material (also known as a soft transparent material). The curable transparent material may include an ultraviolet (UV) curable material, a thermal curable material, or the combinations thereof, for example, poly(methyl methacrylate) (PMMA), polyethylene terephthalate (PET), polyethylene naphthalate (PEN), polycarbonate (PC), perfluorocyclobutyl (PFCB) polymers, polyimide (PI), acrylic resin, epoxy resin, polypropylene (PP), polyethylene (PE), polystyrene (PS), polyvinyl chloride (PVC), transparent photoresist, or the like, or the combinations therefore. In some embodiments, materials of the transparent layer 134 may have a light transmittance larger than 70% or preferably larger than 90% at a wavelength range from 200 nm to 1100 nm to allow the transparent layer 134 to transmit incident light to reach the optical sensor units P.

In some embodiments, the transparent layer 134 may have a plurality of micro-lenses 134a arranged in an array. In some embodiments, the micro-lenses 134a may be semi-convex lenses or convex lenses. In some embodiments, the micro-lenses 134a may have curved top surfaces. In these embodiments, the micro-lenses 134a may have the function of converging incident light rays, so more light may be focused on smaller optical sensor units.

In some embodiments, the light-shielding layers 210 may be disposed on the transparent layer 134 and between the micro-lenses 134a. In some embodiments, the light-shielding layers 210 may include light-shielding materials.

In some embodiments, the light-shielding materials may include ultraviolet curable materials, thermal curable materials, or the combinations thereof, such as resin. In some embodiments, the light-shielding materials may include non-transparent carbon black, ink, molding compound, other suitable materials, or the combinations thereof. In other embodiments, the light-shielding materials may include non-transparent photoresist materials. In some embodiments, the light-shielding materials may have a light transmittance smaller than 1% at a wavelength range from 200 nm to 1200 nm. Or, the light-shielding materials may have a light absorptance larger than 99% at the wavelength range from 200 nm to 1200 nm.

In some embodiments, the light-shielding layers 210 may block or absorb unwanted incident light, and may prevent the optical sensor units P from causing image blur issues due to receiving the unwanted light rays.

Next, according to some embodiments, as shown in FIG. 1, a transparent cover plate 200 may be disposed on the light collimating structure 130. The transparent cover plate 200 may be disposed on the light-shielding layers 210. The transparent cover plate 200 may be formed of a single transparent material, and may be in direct contact with the micro-lenses 134a.

In some embodiments, the transparent cover plate 200 may include soft transparent materials, which are similar to the materials of the transparent layer 134, and the details are not described again herein to avoid repetition. In this embodiment, the transparent cover plate 200 may act as an adhesive layer in middle, in which light source (such as light-emitting diode), blocking layer, other suitable optical elements, or the combinations thereof may be further disposed above, and another cover plate (such as a glass cover plate) may be disposed above these optical elements, to form the optical sensor device, such as the fingerprint identification device.

In other embodiments, the transparent cover plate 200 may include hard transparent materials, for example, glass (such as calcium aluminosilicate glass, soda lime glass), quartz, sapphire, transparent polymer, or other suitable materials. In this embodiment, the transparent cover plate 200 may be disposed on an outermost side of the optical sensor device 10, and may be in direct contact with the surroundings. In other words, in this embodiment, there is no other elements located further out than the transparent cover plate 200. In this case, the transparent cover plate 200 may directly protect elements of the light collimating structure 130, the substrate 100, or the like physically from frictions, scratches, and to reduce device damage by moisture penetration.

In a comparative embodiment, the adhesive layer including the optical cement is used to adhere the transparent cover plate 200 and the light collimating structure 130 (or micro-lenses 134a). In comparison, the present disclosure directly adheres the light collimating structure 130 with the transparent cover plate 200, so the overall thickness of the optical sensor device 10 is reduced by about 5 μm to 20 μm. Furthermore, compared to comparative example of optical sensor device without micro-lenses, which are about 60 μm to 300 μm thick, the overall thickness of the optical sensor device 10 may be reduced to 50 μm or lower, thanks to the design of the micro-lenses 134a of the present disclosure.

In other words, the thickness of the optical sensor device 10 of the present disclosure is about 20 μm to 50 μm, or the thickness of the transparent cover plate 200 occupies 20% to 40% of the thickness of the optical sensor device 10. Therefore, the thickness of the optical sensor device 10 may be significantly reduced by the present disclosure, and the number of the interfaces for the incident light to pass through may also be reduced, thereby ensuring the optical sensor units P may effectively sense the incident light and increase the collimating performance.

In some embodiment, materials of the transparent cover plate 200 may be different from materials of the transparent layer 134, and micro-lenses are formed at a junction of the transparent cover plate 200 and the transparent layer 134, so the incident light may be refracted to elevate the collimating performance. In some embodiments, a refractivity of the materials of the transparent layer 134 is larger than a refractivity of the materials of the transparent cover plate 200. For example, the refractivity of the materials of the transparent layer 134 may be about 1.2 to 1.8, and the refractivity of the materials of the transparent cover plate 200 may be about 1.0 to 1.5. In this embodiment, since the refractivity of the materials of the transparent layer 134 is larger, so the incident angle of the incident light into the transparent layer 134 may be reduced, and more incident lights may enter the optical sensor units P.

Additionally, according to some embodiments, as shown in FIG. 1, the substrate 100 may further include a protective layer 110 disposed on the optical sensor units P. In some embodiments, the protective layer 110 may protect the optical sensor units P from subsequent processes of other optical elements.

Furthermore, according to some embodiments, as shown in FIG. 1, the light collimating structure 130 may further include a light-filtering layer 120 disposed on the substrate 100. In some embodiments, materials of the light-filtering layer 120 may be photoresist materials, and various different wavelengths of incident light rays may be blocked by various photoresist materials. In this embodiment, the light-filtering layer 120 may filter lights, so only lights of specific wavelengths may be transmitted, to prevent interference from light rays of other wavelengths during image sensing, so the resulted image may be clearer. For example, if the incident light is visible light, then the light-filtering layer 120 may be semi-transparent layer to allow sufficient light to transmit and to reach the pixels. In some embodiments, the light-filtering layer 120 may include infrared (IR) cut, which may prevent infrared rays entering the optical sensor units P, and reduce the infrared interference.

Furthermore, according to some embodiments, as shown in FIG. 1, the light collimating structure 130 may further include light-shielding layers 132 disposed between the optical sensor units P, the light-shielding layers 132 and the optical sensor units P are alternately arranged, and are both disposed below the transparent layer 134. The light-shielding layers 132 corresponds to the light-shielding layers 210, and may be at least partially overlapped on a vertical projection direction of the substrate 100. The light-shielding layers 132 may include light-shielding materials, which are similar to the light-shielding materials included in the light-shielding layers 210, and the details are not described again herein to avoid repetition. In some embodiments, the light-shielding layers 132 may further prevent the optical sensor units P from receiving unnecessary light rays, and may also prevent crosstalk generated by light rays entering the optical sensor device 10, so the performance of the optical sensor device 10 may be elevated.

Figure 4:
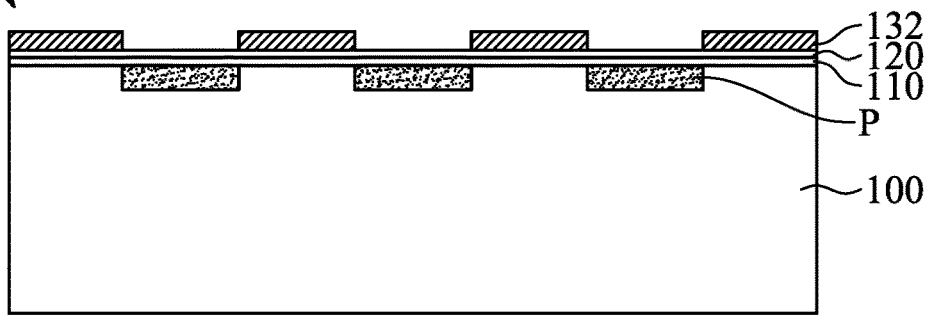
Figure 5:
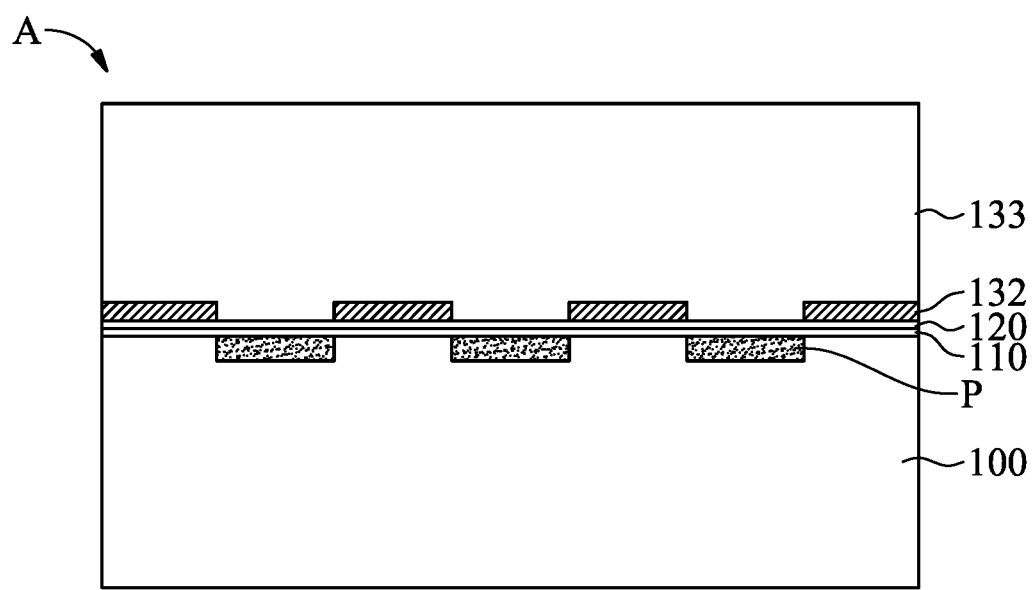
Figure 6:
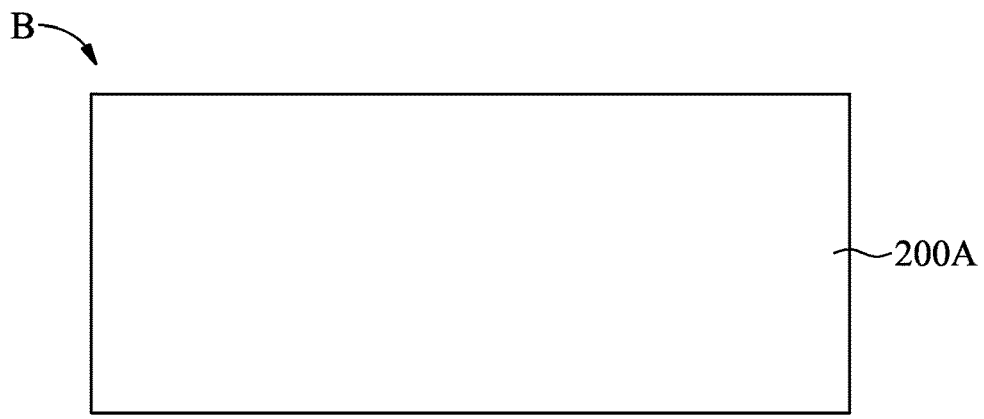
FIGS. 6-8 illustrate cross-sectional views of formations of part of an optical sensor device according to some embodiments of the present disclosure.
Figure 7:
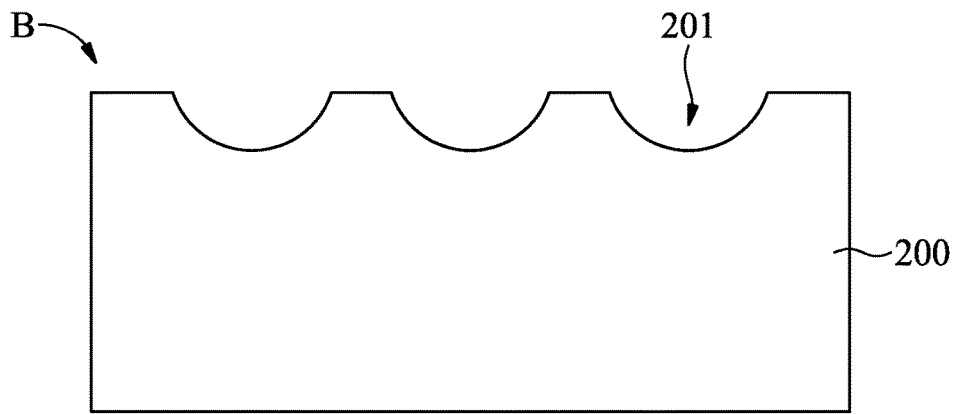
Figure 8:
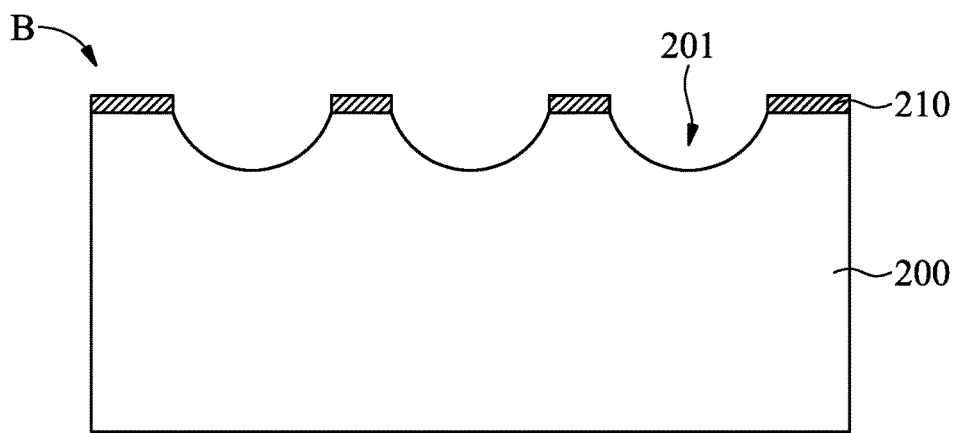

Next, formation methods of the aforementioned optical sensor device 10 may be described by FIGS. 2-5 and FIGS. 6-8. FIGS. 2-5 illustrate cross-sectional views of formation methods of a lower portion A of the optical sensor device 10, according to some embodiments of the present disclosure. FIGS. 6-8 illustrate cross-sectional views of formation methods of an upper portion B of the optical sensor device 10, according to some embodiments of the present disclosure.

Figure 2:
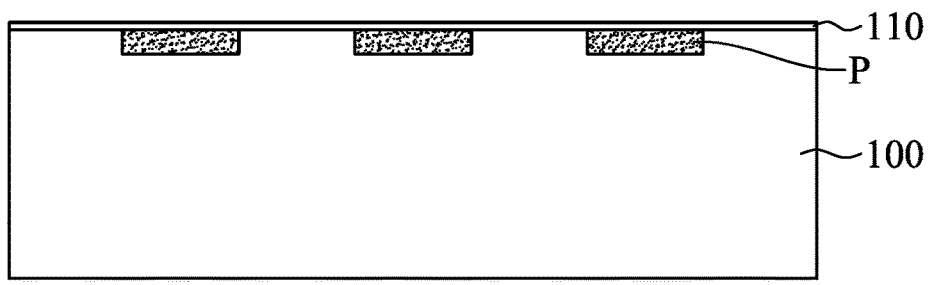
FIGS. 2-5 illustrate cross-sectional views of formations of part of an optical sensor device according to some embodiments of the present disclosure.

First, according to some embodiments, as shown in FIG. 2, in the lower portion A of the optical sensor device 10, a substrate 100 is provided. In particular, the substrate 100 may have a plurality of optical sensor units P therein. A protective layer 110 may be formed on the substrate 100. The formation of the protective layer 110 may include deposition processes, which may include, for example, a spin-on coating process, chemical vapor deposition (CVD), physical vapor deposition (PVD), atomic layer deposition (ALD), other suitable methods, or the combinations thereof.

Figure 3:
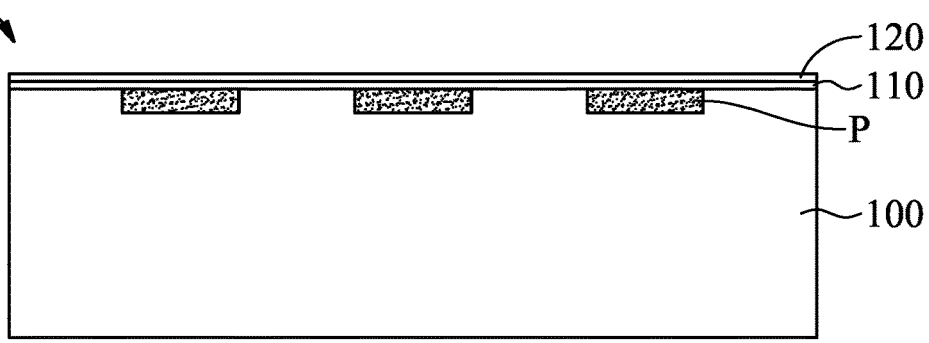

Next, according to some embodiments, as shown in FIG. 3, in the lower portion A of the optical sensor device 10, a light-filtering layer 120 may be formed on the protective layer 110. The formation of the light-filtering layer 120 may include deposition processes, which are similar to the formation of the protective layer 110, and the details are not described again herein to avoid repetition. In some embodiments, the formation of the light-filtering layer 120 may also include printing, such as inkjet printing.

Next, according to some embodiments, as shown in FIG. 4, in the lower portion A of the optical sensor device 10, light-shielding layers 132 is formed on the substrate 100 between the optical sensor units P.

In the embodiments where the light-shielding layers 132 are non-transparent photoresist materials, the formation of the light-shielding layers 132 may include a patterning process. In this embodiment, the patterning process may include a lithography process, which includes photoresist coating (for example, spin-on coating), soft bake, pattern exposure, bake after exposure, photoresist developing, rinse and dry (for example, hard bake), other suitable processes, or the combinations thereof. The light-shielding layers 132 may be formed directly on areas without the optical sensor units P, without the need of additional etching processes.

In other embodiments, the formation of the light-shielding layers 132 may include deposition processes and patterning processes. The deposition processes are similar to what described earlier, and the details are not described again herein to avoid repetition. The patterning processes may include lithography processes and etching processes. The lithography processes may include photoresist coating (for example, spin-on coating), soft bake, pattern exposure, bake after exposure, photoresist developing, rinse and dry (for example, hard bake), other suitable processes, or the combinations thereof. The etching processes may include wet etching process, dry etching process (for example, reactive ion etching (RIE), plasma etching, ion grinding), other suitable processes, or the combinations thereof. Furthermore, the patterning processes may further include removal processes, which may include strip processes, ash processes, the combinations thereof, to remove the photoresist. In other words, the light-shielding materials may first be deposited on the substrate 100 by the deposition processes, then the light-shielding materials are patterned by the patterning processes, to form the light-shielding layers 132.

Next, according to some embodiments, as shown in FIG. 5, in the lower portion A of the optical sensor device 10, a curable transparent material (soft transparent material) 133 may be formed on the substrate 100. The formation of the curable transparent material 133 may include deposition processes, which are similar to the formation of the protective layer 110, and the details are not described again herein to avoid repetition.

On the other hand, according to some embodiments, as shown in FIG. 6, in the upper portion B of the optical sensor device 10, a transparent material 200A is provided as the transparent template. The transparent material 200A may include soft transparent materials or hard transparent materials, in which the details are as described previously, so the details are not described again herein to avoid repetition.

Next, according to some embodiments, as shown in FIG. 7, in the upper portion B of the optical sensor device 10, the transparent material 200A may be patterned to form a transparent template 200 having a plurality of concaves 201.

In the case where the transparent material 200A is hard transparent material, the patterning of the transparent material 200A may include patterning processes, which may include lithography and etching processes, which are similar to what has been described earlier, so the details are not described again herein to avoid repetition. In some embodiments, the lithography processes may include using a gray-scale mask, which may have different light transmittance along any direction, so the materials to be patterned may have different depths along that direction. For example, the middle portion of the gray-scale mask may have higher light transmittance than portions on two sides, so the materials after exposure may have concaves. In comparison with conventional step masks, the gray-scale mask used in the embodiment of the present disclosure may generate patterns with various depths, for example, concaves 201, by controlling exposure magnitude of the materials to be patterned, so the micro-lenses may be imprinted subsequently.

In the case where the transparent material 200A is soft transparent material, the patterning of the transparent material 200A may include patterning processes, which are similar to what has been described earlier, so the details are not described again herein to avoid repetition. In this case, the patterning of the transparent material 200A may also use other templates to imprint the transparent material 200A. In particular, other hard templates having a plurality of convexes may be used, so a plurality of concaves 201 may be formed on the transparent material 200A, which may then be cured to form the transparent template 200.

Next, according to some embodiments, as shown in FIG. 8, in the upper portion B of the optical sensor device 10, a plurality of light-shielding layers 210 may be formed on the transparent template 200 between the concaves 201. The formation of the light-shielding layers 210 is similar to the formation of the light-shielding layers 132, and the details are not described again herein to avoid repetition.

Next, according to some embodiments, the transparent template 200 including the light-shielding layers 210 may be flipped over, so concaves 201 may face the curable transparent material 133, and may be assembled onto the structure as shown in FIG. 5, to form the optical sensor device 10 as shown in FIG. 1. In particular, the curable transparent material 133 is imprinted with the transparent template 200, to form a plurality of convexes corresponding to the plurality of concaves, as shown in FIG. 1.

Next, according to some embodiments, the curable transparent material 133 may be cured, to form the transparent layer 134 having the array of micro-lenses 134a. In particular, the curing of the curable transparent material 133 may include adhering the transparent template 200 onto the curable transparent material 133, to act as a cover plate for the optical sensor device 10.

In some embodiments, the curing processes may include an ultraviolet curing process, a thermal curing process, or the combinations thereof. The curable materials may be cured by choosing suitable curing conditions, according to the characteristics of the curable transparent material 133.

In a comparative embodiment, micro-lenses are formed on the transparent layer using adhesive methods. In order to prevent misalignment of the micro-lenses during adhesion, the light-shielding layers may be horizontally extended beneath the micro-lenses. In comparison, according to the embodiments of the present disclosure, the transparent layer 134 having micro-lenses 134a may be formed by the transparent template 200 having the light-shielding layers 210 (in other words, no additional micro-lenses are needed to be adhered onto the transparent layer 134). Two sides of each light-shielding layer 210 may be substantially aligned with adjoining micro-lenses 134a, to reduce valid incident lights being absorbed or blocked by the light-shielding layers 210.

In the embodiments of the present disclosure, since the transparent layer 134 having micro-lenses 134a may be formed directly with the curable transparent material 133, no additional adhesive layer is required between the transparent layer 134 and the micro-lenses 134a. As a result, at least two interfaces may be eliminated in an optical path of collimation, and the overall thickness of the optical sensor device 10 may be reduced, thereby increasing the collimation performance.

Figure 9:
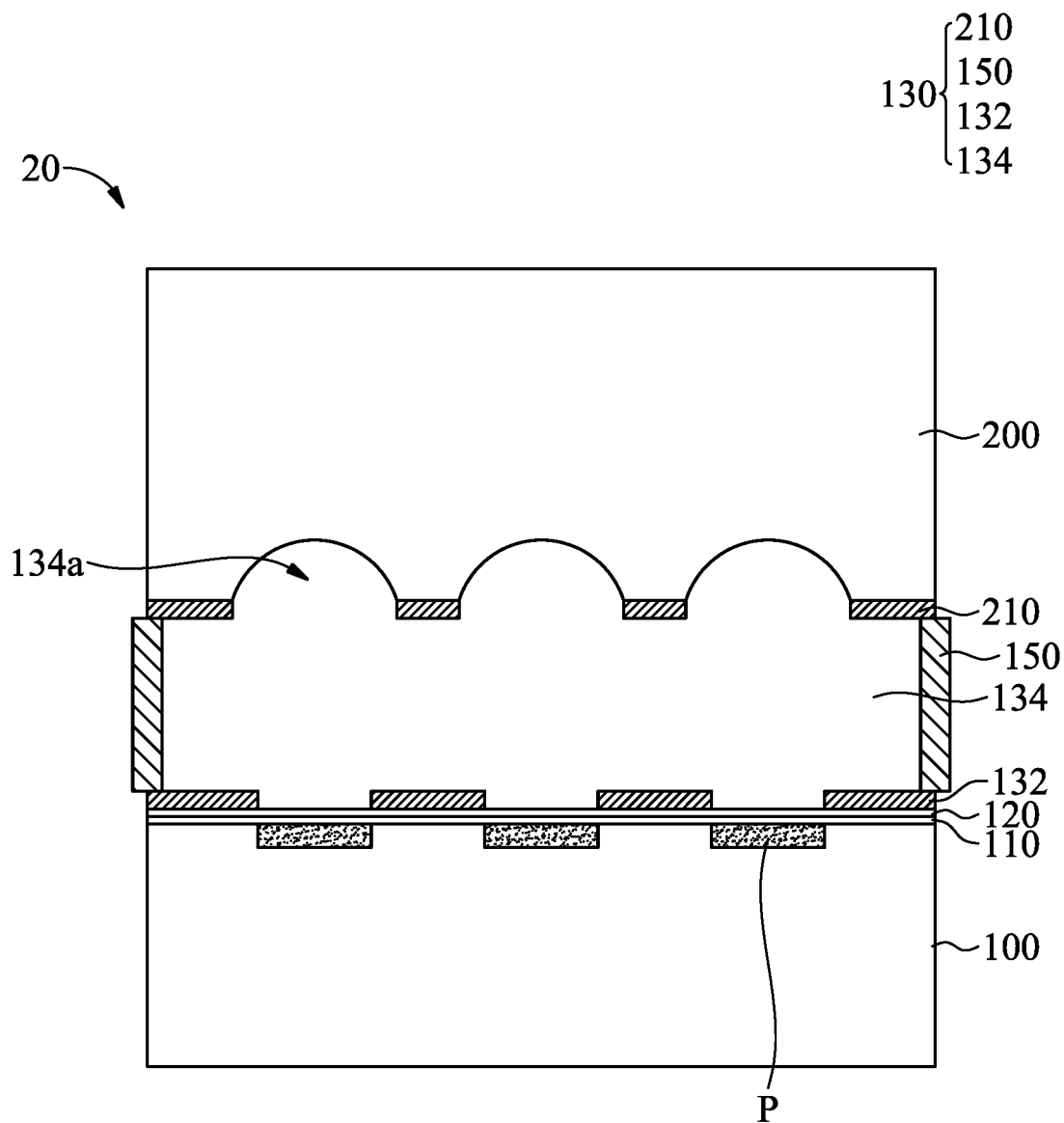
FIGS. 9-13 illustrate cross-sectional views of an optical sensor device according to other embodiments of the present disclosure.

FIG. 9 illustrates a cross-sectional view of an optical sensor device 20, according to other embodiments of the present disclosure. A difference between the optical sensor device 20 and the optical sensor device 10 is further forming dams on two sides of the substrate 100 before forming the curable transparent material 133 on the substrate 100. In some embodiments, the light collimating structure 130 may include dams 150 located on two sides of the transparent layer 134. In some embodiments, materials of the dams 150 may include ultraviolet curable materials, thermal curable materials, or the combinations thereof, for example, methacrylic resin, unsaturated polyester, epoxy resin, or the like. In some embodiments, dam materials may first be formed, and a curing process may be performed based on the characteristics of the materials to form a cured transparent material. In this embodiment, the first formed dams 150 may further control heights to be equal at every location of the transparent layer 134 formed subsequently, to prevent tilting on the optical sensor device 20.

Figure 10:
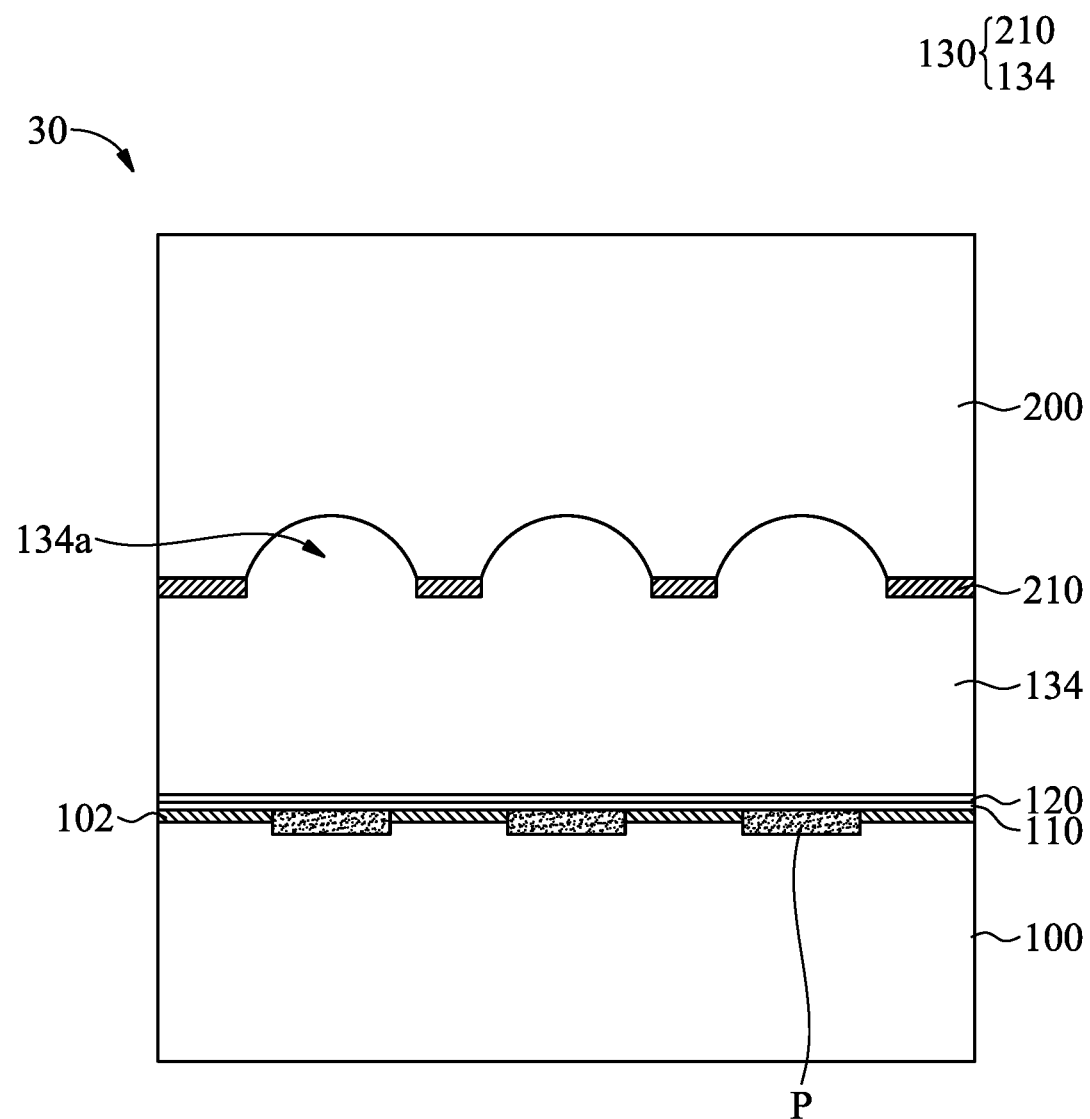

FIG. 10 illustrates a cross-sectional view of an optical sensor device 30, according to other embodiments of the present disclosure. A difference between the optical sensor device 30 and the optical sensor device 10 is further including a plurality of metal layers 102 within the substrate 100 between the optical sensor units P, to replace the light-shielding layers 132 on the substrate 100 between the optical sensor units P. The metal layers 102 and the optical sensor units P are alternately arranged, and are disposed below the transparent layer 134. The metal layers 102 may correspond to the light-shielding layers 210, and may be at least partially overlapped on a vertical projection direction of the substrate 100. In some embodiments, the light collimating structure 130 may not include the light-shielding layers 132. Materials of the metal layers 102 may include Cu, W, Ag, Sn, Ni, Co, Cr, Ti, Pb, Au, Bi, Sb, Zn, Zr, Mg, In, Te, Ga, other suitable metal materials, alloys thereof, or the combinations thereof. The formation of the metal layers 102 may include deposition processes and patterning processes, which may be similar to what has been described earlier. The formation of the metal layers 102 may also include damascene processes. In this embodiment, since the metal layer 102 is formed within the substrate 100, two interfaces, of the light-shielding layers 132, where the incident light passing through may be further eliminated, thereby increasing the collimating performance.

Figure 11:
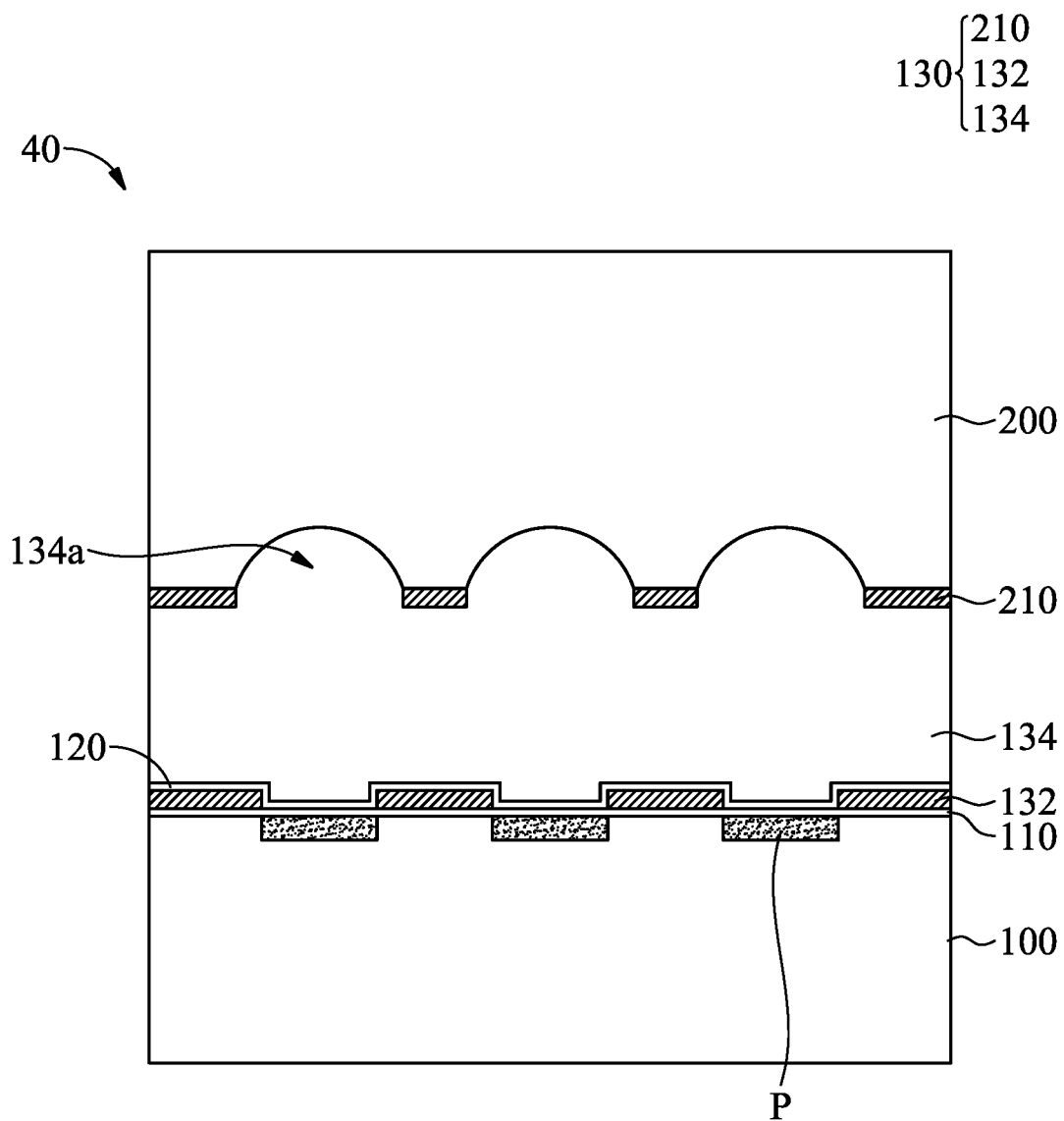

FIG. 11 illustrates a cross-sectional view of an optical sensor device 40, according to other embodiments of the present disclosure. A difference between the optical sensor device 40 and the optical sensor device 10 is that the light-shielding layers 132 is formed before forming the light-filtering layer 120 on the light-shielding layers 132. In this embodiment, the light-filtering layer 120 formed latter may further protect the light-shielding layers 132 from subsequent processes.

Figure 12:
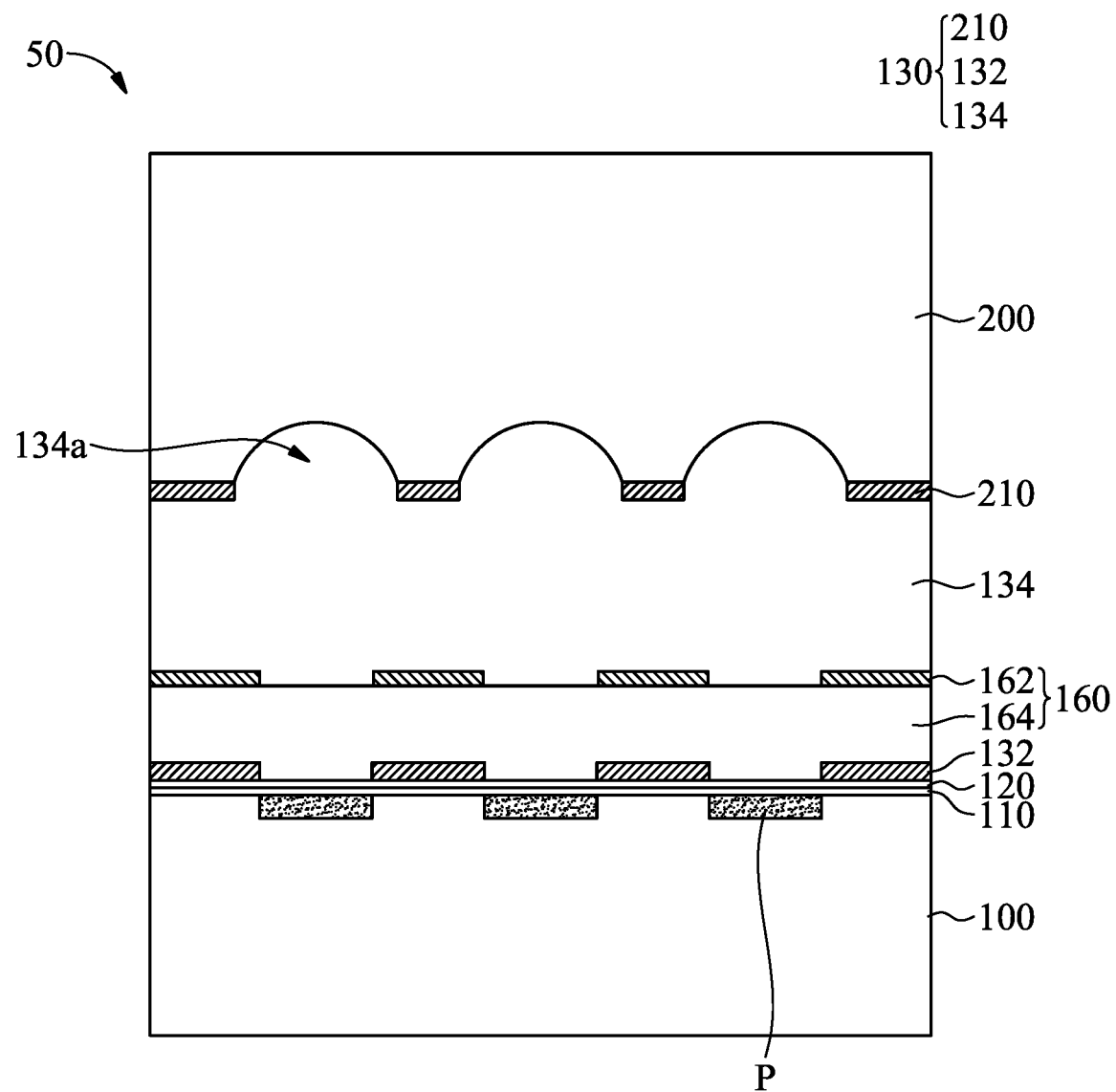

FIG. 12 illustrates a cross-sectional view of an optical sensor device 50, according to other embodiments of the present disclosure. A difference between the optical sensor device 50 and the optical sensor device 10 is further forming another light collimating structure 160 on the substrate 100 before the formation of the curable transparent material 133 on the substrate 100. In particular, the other light collimating structure 160 may include a plurality of light shielding layers 162 and a transparent layer 164.

In some embodiments, the transparent layer 164 may be disposed on the substrate 100. Materials of the transparent layer 164 may include soft or hard transparent materials, and the formation of the transparent layer 164 is similar to what has been described earlier, and the details are not described again herein to avoid repetition.

In some embodiments, the plurality of light-shielding layers 162 may be disposed on the transparent layer 164, and may be corresponded to the light-shielding layers 210. In some embodiments, the light-shielding layers 162 may also be corresponded to the light-shielding layers 132. Materials and the formation of the light-shielding layers 162 may be similar to the light-shielding layers 210, and the details are not described again herein to avoid repetition. In this embodiment, the light-shielding layers 162, corresponding to the light-shielding layers 210, may further absorb or block unwanted incident lights without blocking incident lights to be sensed by the optical sensor units P.

In this embodiment, even though only one layer of the light-shielding layers 162 and one layer of the transparent layer 164 are illustrated, any modifications may be made based on actual demands. Since there are additional light-shielding layers 162 in this embodiment, distortion issues during image sensing may be further prevented, and the issue of crosstalk generated from the incident lights may also be prevented, to elevate the collimating performance.

Figure 13:
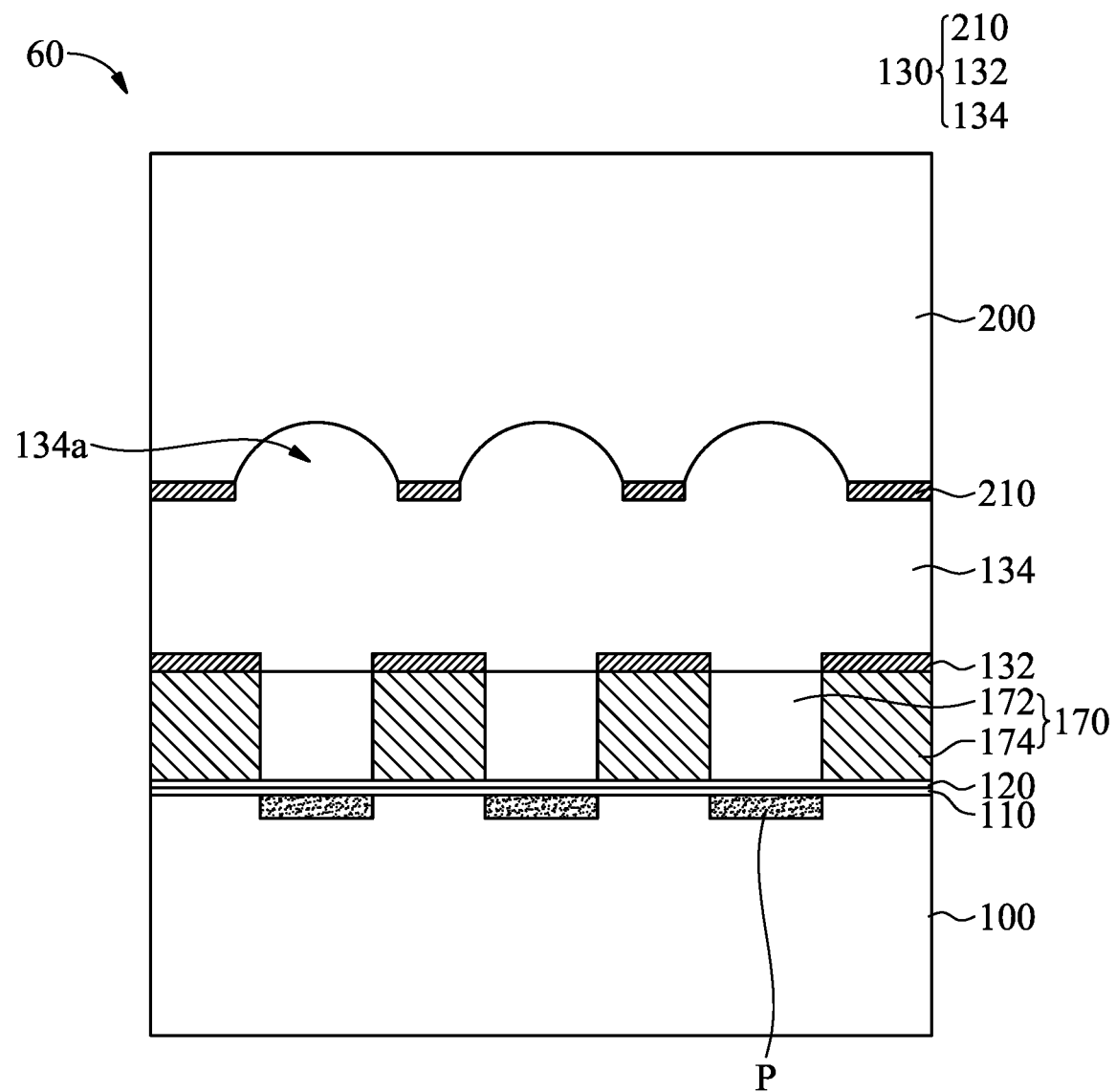

FIG. 13 illustrates a cross-sectional view of an optical sensor device 60, according to other embodiments of the present disclosure. A difference between the optical sensor device 60 and the optical sensor device 10 is further forming another light collimating structure 170 on the substrate 100 before the formation of the curable transparent material 133 on the substrate 100. In particular, the other light collimating structure 170 may include transparent pillars 172 and the light-shielding layers 174.

In some embodiments, the transparent pillars 172 may be disposed on the optical sensor units P within the substrate 100. Materials of the transparent pillars 172 may be similar to the transparent layer 164, and the details are not described again herein to avoid repetition. The formation of the transparent pillars 172 may include deposition processes and patterning processes, which may be similar to what has been described earlier, and the details are not described again herein to avoid repetition.

In some embodiments, the transparent pillars 172 may be surrounded by the light-shielding layers 174. Materials of the light-shielding layers 174 may include light-shielding materials, which may be similar to the light-shielding layers 210, and the details are not described again herein to avoid repetition. The formation of the light-shielding layers 174 may include curing processes or deposition processes, which may be similar to what has been described earlier, and details are not described again herein to avoid repetition. The formation of the light-shielding layers 174 may further include planarization processes, so top portions of the light-shielding layers 174 and top portions of the transparent pillars 172 are at the same level, to facilitate subsequent processes of the light-shielding layers 132 and the transparent layer 134. The planarization processes include chemical mechanical polishing (CMP) processes, etch back processes, other suitable processes, or combinations thereof.

In this embodiment, the transparent pillars 172 are first formed on the optical sensor units P, followed by the formation of the light-shielding layers 174 between the transparent pillars 172, which may effectively prevent the optical sensor units P from being shielded by debris or contaminants during process, so process yield may be significantly elevated.

The present disclosure may omit an adhesive layer between the transparent cover plate and the micro-lenses, and between the micro-lenses and the transparent layer, by directly forming the transparent layer having the micro-lenses with the curable transparent material. Therefore, with the thickness and the interfaces of the adhesive layer eliminated, the collimating performance of the optical sensor device may be elevated. Furthermore, the micro-lenses may ensure the optical sensor units to effectively sense the incident lights, and to increase the collimating performance. In other words, the optical sensor device and methods forming the same, according to some embodiments of the present disclosure, not only can elevate the collimating performance of the optical sensor device, may also elevate process yield significantly while reducing process cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor device, comprising:
a substrate having a plurality of optical sensor units therein;
a first light collimating structure on the substrate, comprising:
a first transparent layer having a plurality of micro-lenses arranged in an array; and
a plurality of first light-shielding layers on the first transparent layer between the plurality of micro-lenses, wherein the plurality of first light-shielding layers does not cover the plurality of micro-lenses in a direction along a top surface of the substrate, and wherein the plurality of micro-lenses are convex portions of the first transparent layer without an interface between the plurality of micro-lenses and the first transparent layer; and
a transparent cover plate disposed on the first light collimating structure, wherein the transparent cover plate is formed of a single transparent material, and is in direct contact with the plurality of micro-lenses, wherein the first light collimating structure further comprises a plurality of second light-shielding layers on the substrate between the plurality of optical sensor units, and the plurality of first light-shielding layers correspond to the plurality of second light-shielding layers, respectively, and at least partially overlaps on a vertical projection direction.

2. The optical sensor device of claim 1, wherein the substrate further comprises a plurality of metal layers between the plurality of optical sensor units, and the plurality of metal layers correspond to the plurality of first light-shielding layers, respectively, and at least partially overlaps on a vertical projection direction.

3. The optical sensor device of claim 1, wherein a material of the first transparent layer is a curable transparent material.

4. The optical sensor device of claim 1, wherein materials of the first transparent layer and the transparent cover plate are different.

5. The optical sensor device of claim 1, wherein a refractivity of the first transparent layer is larger than a refractivity of the transparent cover plate.

6. The optical sensor device of claim 1, wherein the first light collimating structure further comprises a dam located on opposing sides of the first transparent layer.

7. The optical sensor device of claim 1, further comprises a second light collimating structure on the substrate.

8. The optical sensor device of claim 7, wherein the second light collimating structure comprises:
a second transparent layer on the substrate; and
a plurality of third light-shielding layers on the second transparent layer and corresponding to the plurality of first light-shielding layers.

9. The optical sensor device of claim 7, wherein the second light collimating structure comprises:
a plurality of transparent pillars on the plurality of optical sensor units within the substrate; and
a plurality of fourth light-shielding layers surrounding the plurality of transparent pillars.

10. The optical sensor device of claim 1, wherein the substrate further comprises a protective layer on the plurality of optical sensor units.

11. The optical sensor device of claim 1, wherein a thickness of the transparent cover plate occupies 20% to 40% of a thickness of the optical sensor device.

12. A method of forming an optical sensor device as claimed in claim 1, comprising:
forming a curable transparent material on a substrate, wherein the substrate has a plurality of optical sensor units therein;
providing a transparent template, wherein the transparent template has a plurality of concaves;
imprinting the curable transparent material with the transparent template to form a plurality of convexes corresponding to the plurality of concaves; and
curing the curable transparent material to form a transparent layer having an array of micro-lenses, wherein the curing of the curable transparent material comprises adhering the transparent template to the curable transparent material to act as a cover plate for the optical sensor device.

13. The method of claim 12, wherein the providing of the transparent template comprises:
providing a transparent material; and
patterning the transparent material to form the transparent template having the plurality of concaves.

14. The method of claim 13, wherein the patterning of the transparent material comprises imprinting the transparent material using another template.

15. The method of claim 13, wherein the patterning of the transparent material comprises performing a lithography process and an etching process on the transparent material.

16. The method of claim 15, wherein the lithography process comprises using a gray-scale mask.

17. The method of claim 12, further comprising forming a plurality of first light-shielding layers on the transparent template between the plurality of concaves before the imprinting of the curable transparent material with the transparent template.

18. The method of claim 12, further comprises forming a plurality of second light-shielding layers on the substrate between the plurality of optical sensor units before the forming of the curable transparent material on the substrate.

19. The method of claim 12, wherein the substrate further comprises a plurality of metal layers between the plurality of optical sensor units.

20. The method of claim 12, further comprises forming a dam on opposing sides of the substrate before the forming of the curable transparent material on the substrate.

21. The method of claim 12, further comprising forming a second light collimating structure on the substrate before the forming of the curable transparent material on the substrate.

* * * * *